United States Patent
Zhang et al.

(10) Patent No.: US 9,997,476 B2
(45) Date of Patent: Jun. 12, 2018

(54) MULTI-DIE PACKAGE HAVING DIFFERENT TYPES OF SEMICONDUCTOR DIES ATTACHED TO THE SAME THERMALLY CONDUCTIVE FLANGE

(71) Applicant: Infineon Technologies AG, Neubiberg (DE)

(72) Inventors: Xikun Zhang, Shanghai (CN); Dejiang Chang, Shanghai (CN); Bill Agar, Morgan Hill, CA (US); Michael Lefevre, Morgan Hill, CA (US); Alexander Komposch, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 14/928,812

(22) Filed: Oct. 30, 2015

(65) Prior Publication Data

US 2017/0125362 A1    May 4, 2017

(51) Int. Cl.
*H01L 23/66* (2006.01)
*H01L 23/00* (2006.01)
(Continued)

(52) U.S. Cl.
CPC ........ *H01L 23/66* (2013.01); *H01L 23/49503* (2013.01); *H01L 23/49568* (2013.01);
(Continued)

(58) Field of Classification Search
CPC ......... H01L 23/49503; H01L 23/49575; H01L 25/072; H01L 2223/6644; H01L 2223/6672; H03F 3/211
See application file for complete search history.

(56) References Cited

U.S. PATENT DOCUMENTS 3,823,467 A    7/1974    Shamash et al.
3,986,196 A    10/1976    Decker et al.
(Continued)

FOREIGN PATENT DOCUMENTS

CN    103219317 A    7/2013
DE    10223035 A1    12/2003
(Continued)

OTHER PUBLICATIONS

"RF Power LDMOS Transistors", Freescale Semiconductor Technical Data Sheet, Sep. 2013, Revision 1, Document No. AFT09H310-035, pp. 1-18.
(Continued)

*Primary Examiner* — Mohsen Ahmadi
(74) *Attorney, Agent, or Firm* — Murphy, Bilak & Homiller, PLLC

(57) ABSTRACT

A multi-die package is manufactured by attaching a first semiconductor die made of a first semiconductor material to a thermally conductive flange via a first die attach material, and attaching a second semiconductor die to the same thermally conductive flange as the first semiconductor die via a second die attach material. The second semiconductor die is made of a second semiconductor material different than the first semiconductor material. The first semiconductor die is held in place by the first die attach material during attachment of the second semiconductor die to the flange. Leads are attached to the thermally conductive flange or to an insulating member secured to the flange. The leads provide external electrical access to the first and second semiconductor dies.

12 Claims, 8 Drawing Sheets

(51) Int. Cl.
*H01L 23/498* (2006.01)
*H01L 23/495* (2006.01)
*H01L 25/07* (2006.01)
*H01L 29/16* (2006.01)
*H01L 25/00* (2006.01)

(52) U.S. Cl.
CPC .. *H01L 23/49575* (2013.01); *H01L 23/49844* (2013.01); *H01L 24/27* (2013.01); *H01L 24/32* (2013.01); *H01L 24/83* (2013.01); *H01L 25/072* (2013.01); *H01L 25/50* (2013.01); *H01L 29/16* (2013.01); *H01L 2223/6644* (2013.01); *H01L 2223/6672* (2013.01); *H01L 2224/29111* (2013.01); *H01L 2224/32245* (2013.01); *H01L 2224/83136* (2013.01); *H01L 2924/014* (2013.01); *H01L 2924/01029* (2013.01); *H01L 2924/01047* (2013.01); *H01L 2924/01079* (2013.01); *H01L 2924/1033* (2013.01); *H01L 2924/10253* (2013.01); *H01L 2924/13091* (2013.01); *H01L 2924/19041* (2013.01)

(56) References Cited

U.S. PATENT DOCUMENTS

| | | |
|---|---|---|
| 5,040,996 A | 8/1991 | Kobold et al. |
| 5,182,632 A | 1/1993 | Bechtel et al. |
| 5,414,592 A | 5/1995 | Stout et al. |
| 5,438,478 A | 8/1995 | Kondo et al. |
| 5,728,248 A | 3/1998 | Weber |
| 5,736,781 A | 4/1998 | Atsumi |
| 5,754,402 A | 5/1998 | Matsuzaki et al. |
| 5,776,512 A | 7/1998 | Weber |
| 5,798,014 A | 8/1998 | Weber |
| 5,843,808 A | 12/1998 | Karnezos |
| 5,973,389 A | 10/1999 | Culnane et al. |
| 6,062,089 A | 5/2000 | Ichihashi |
| 6,261,868 B1 | 7/2001 | Miller et al. |
| 6,329,713 B1 | 12/2001 | Farquhar et al. |
| 6,511,866 B1 | 1/2003 | Bregante et al. |
| 6,521,982 B1 * | 2/2003 | Crowley ........... H01L 23/49513 257/139 |
| 7,298,046 B2 | 11/2007 | Venegas et al. |
| 7,582,964 B2 | 9/2009 | Venegas et al. |
| 8,013,429 B2 | 9/2011 | Mohammed et al. |
| 8,847,680 B2 | 9/2014 | Bowles et al. |
| 8,907,467 B2 | 12/2014 | Komposch et al. |
| 9,077,285 B2 * | 7/2015 | Holmes ................. H03F 1/0288 |
| 2003/0151128 A1 | 8/2003 | Kawaguchi |
| 2004/0262781 A1 * | 12/2004 | Germain ............ H01L 23/3107 257/787 |
| 2008/0019108 A1 | 1/2008 | Hoyer et al. |
| 2009/0051018 A1 | 2/2009 | Moline et al. |
| 2010/0032825 A1 * | 2/2010 | Elliott ................... H01L 23/045 257/692 |
| 2012/0231753 A1 | 9/2012 | Maslennikov et al. |
| 2012/0286866 A1 | 11/2012 | Khanifar et al. |
| 2012/0293251 A1 | 11/2012 | Chen et al. |
| 2013/0081867 A1 | 4/2013 | Masuda et al. |
| 2013/0154068 A1 * | 6/2013 | Sanchez ............. H01L 23/4334 257/675 |
| 2013/0256858 A1 | 10/2013 | Komposch et al. |
| 2014/0256090 A1 | 9/2014 | Interrante et al. |
| 2014/0332941 A1 * | 11/2014 | Viswanathan ......... H01L 24/97 257/675 |
| 2015/0102383 A1 | 4/2015 | Golland et al. |
| 2015/0303881 A1 | 10/2015 | Blednov et al. |
| 2017/0103927 A1 * | 4/2017 | Bishop .................... H01L 22/26 |

FOREIGN PATENT DOCUMENTS

| | | |
|---|---|---|
| DE | 102010038246 A1 | 8/2011 |
| EP | 2575167 A2 | 4/2013 |
| JP | H10242377 A | 9/1998 |
| JP | 2003179181 A | 6/2003 |
| JP | 4296778 B2 | 7/2009 |

OTHER PUBLICATIONS

"RF Power Product Selection Guide: LDMOS Transistors and ICs", Feb. 2014, Infineon Technologies AG, pp. 1-6.

* cited by examiner

MULTI-DIE PACKAGE HAVING DIFFERENT TYPES OF SEMICONDUCTOR DIES ATTACHED TO THE SAME THERMALLY CONDUCTIVE FLANGE

TECHNICAL FIELD

The present application relates to multi-die packages, in particular multi-die packages having different types of semiconductor dies attached to the same thermally conductive flange.

BACKGROUND

Many types of power amplifier packages include more than one semiconductor die. For example, a Doherty power amplifier package includes a main amplifier and a peaking amplifier in the same package. For next generation cellular communication systems, high speed data rate, high capacity and green energy considerations are predominant trends, which force Doherty power amplifiers to become more efficient and have wider bandwidth. These requirements are difficult to realize with current LDMOS (laterally diffused metal oxide semiconductor) technology, due to LDMOS transistor limitations in reducing device parasitics. GaN technology is an alternative solution that can provide additional performances where LDMOS technology is limited. However, GaN technology is more expensive and not as linear as LDMOS. As such, there is a need to integrate dies of different semiconductor material types in the same power amplifier package.

SUMMARY

According to an embodiment of a method of manufacturing a multi-die package, the method comprises: attaching a first semiconductor die made of a first semiconductor material to a thermally conductive flange via a first die attach material; attaching a second semiconductor die to the same thermally conductive flange as the first semiconductor die via a second die attach material, the second semiconductor die being made of a second semiconductor material different than the first semiconductor material, and wherein the first semiconductor die is held in place by the first die attach material during attachment of the second semiconductor die to the flange; and attaching leads to the thermally conductive flange or to an insulating member secured to the flange, the leads providing external electrical access to the first and second semiconductor dies.

According to an embodiment of a multi-die package, the package comprises a thermally conductive flange, a first semiconductor die made of a first semiconductor material attached to the thermally conductive flange via a first die attach material, a second semiconductor die attached to the same thermally conductive flange as the first semiconductor die via a second die attach material, and leads attached to the thermally conductive flange or to an insulating member secured to the flange. The leads are configured to provide external electrical access to the first and second semiconductor dies. The second semiconductor die is made of a second semiconductor material different than the first semiconductor material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described next are embodiments of a multi-die package having two or more semiconductor dies attached to the same thermally conductive flange and wherein the dies are made of different semiconductor materials, and corresponding methods of manufacturing the multi-die package. For example in the case of GaN and LDMOS technologies, GaN and LDMOS dies are both used within the same package and attached to the same thermally conductive flange. Such an arrangement is lower cost than an all-GaN solution and easier to linearize since LDMOS technology is used along with one or more GaN devices. Using a Doherty amplifier as an example, a GaN power amplifier die included in the multi-die package can be used as the main amplifier so as to take advantage of higher GaN performance. An LDMOS power amplifier die included in the same multi-die package can be used as the peaking amplifier so as to provide sufficient linearity and not degrade overall performance.

In general, any combination of two or more semiconductor dies made of different semiconductor materials such as SiGe, Si, GaN e.g. on Si or SiC, GaAs, InGaAs, etc. can be attached to the same thermally conductive flange in the same package. In the case of a power amplifier design, the multi-die package provides two or more amplify paths within the package. One or more of the semiconductor dies included in the package can be a passive semiconductor die devoid of active devices such as a capacitor, resistor or an inductor die. The multi-die package can include a ceramic window frame or other type of electrically insulating window frame attached to the thermally conductive flange for supporting metal leads of the package. In another case, the leads are formed as part of a circuit board and the circuit board is attached to the thermally conductive flange. The multi-die package can have a lid for enclosing the dies within an open cavity.

Figure 1:
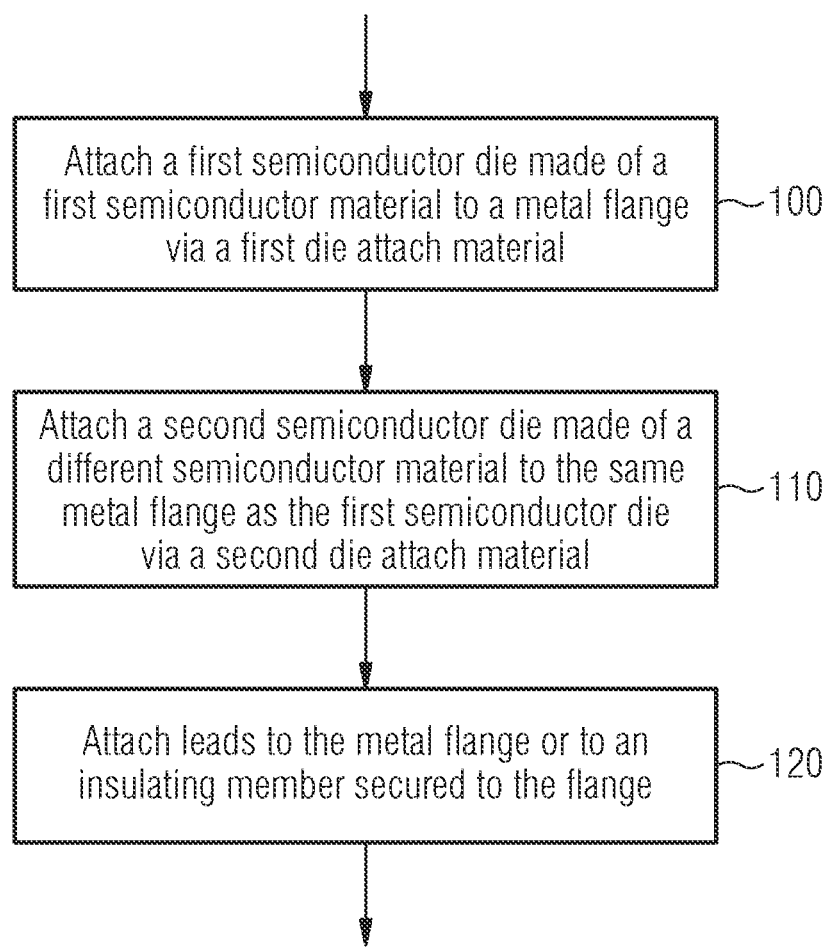
FIG. 1 illustrates a flow diagram of an embodiment of a method of manufacturing a multi-die package.
Figure 2:
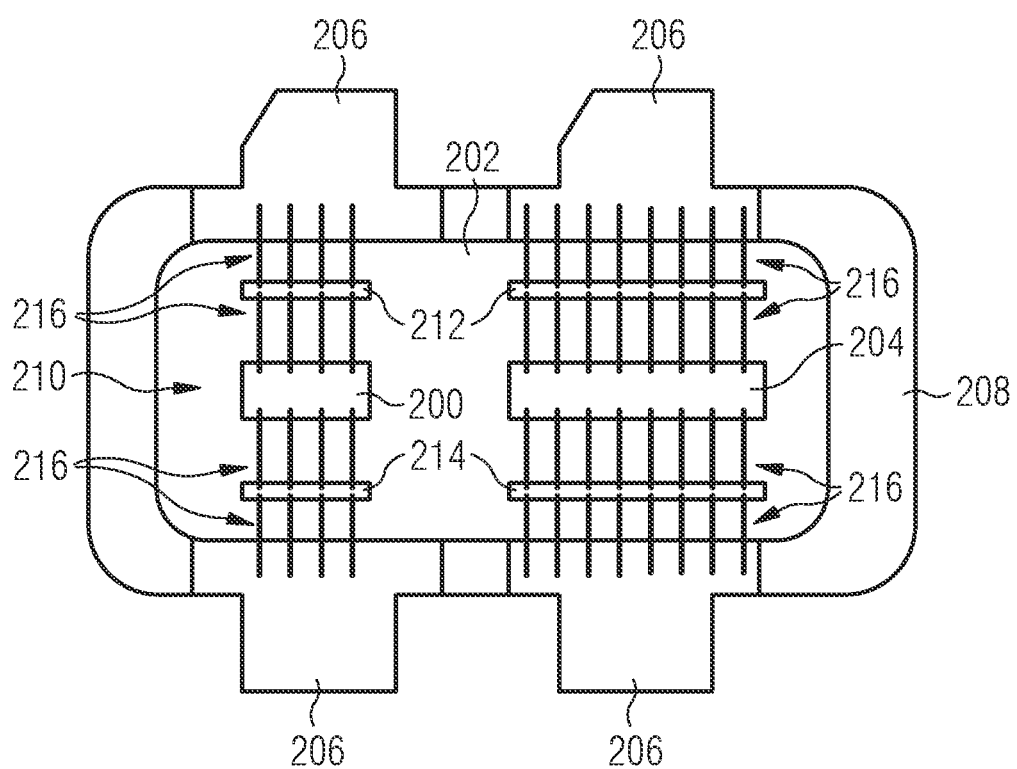
FIG. 2 illustrates a top-down plan view of an embodiment of a multi-die package.

FIG. 1 illustrates an embodiment of a method of manufacturing a multi-die package having two or more semiconductor dies attached to the same thermally conductive flange and wherein the dies are made of different semiconductor materials, and FIG. 2 illustrates a top-down plan view of an embodiment of a multi-die package manufactured according to the method of FIG. 1.

The method illustrated in FIG. 1 includes attaching a first semiconductor die 200 made of a first semiconductor material to a thermally conductive flange 202 via a first die attach material (out of view in FIG. 2) (Block 100). The thermally conductive flange 202 can comprise any thermally (and optionally electrically) conductive material such as Cu, CPC (copper, copper-molybendum, copper laminate structure), CuMo, CuW, Alu, diamond heatspreader, CuMo heatspreader, Cu-composite, Al-composite, diamond-composite, or any other suitable thermally conductive material, and any combination thereof.

The method further includes attaching a second semiconductor die 204 to the same thermally conductive flange 202 as the first semiconductor die 200 via a second die attach material (out of view in FIG. 2), the second semiconductor die 204 being made of a second semiconductor material different than the first semiconductor material (Block 110). Because different semiconductor materials are used for the dies 200, 204, the die attach materials may be the same or different. Also due to the different semiconductor materials used, the dies 200, 204 may be biased at different voltages. For example, GAN and LDMOS power transistor dies often use 28V or 50V drain voltage, and GaAs and Si transistor power dies often use 5V or 12V drain voltage.

In each case, semiconductor dies 200, 204 of dissimilar semiconductor materials are attached to the same thermally conductive flange 202. Also, the first semiconductor die 200 held in place by the first die attach material during attachment of the second semiconductor die 204 to the flange 202.

In one embodiment, the die attach materials used to attach the semiconductor dies 200, 204 to the thermally conductive flange 202 are different so that the first semiconductor die 200 remains fixedly attached to the flange 202 during attachment of the second semiconductor die 204 to the flange 202.

The term 'die attach temperature range' as used herein refers to the temperature range at which a die attach material joins or fixes a semiconductor die to a thermally conductive flange i.e. partial or full solidification. For example in the case of a eutectic metal system such as AuSi, AuSn, AgSn, CuSn, etc., the die attach temperature range refers to the temperature range at which the eutectic metal alloy transforms from solid to liquid state. In the case of an electrically conductive glue or epoxy, the die attach temperature range refers to the temperature range at which the material cures or sets. In the case of a solder or sinter paste, the die attach temperature range refers to the temperature range at which the solder or sinter paste melts.

The die attach material used to attach each semiconductor die 200, 204 to the thermally conductive flange 202 depends on the type of semiconductor material from which each die is made. For example in the case of a Si or GaN die, the following die attach materials can be used: AuSn pre-applied on the die backside; AuSn preform; solder paste; solder preform; sinter material; conductive or non-conductive adhesive such as glue or epoxy; etc.

In another embodiment, the first die attach material partly or fully solidifies during attachment of the first semiconductor die 200 to the thermally conductive flange 202 and remains partly or fully solidified during attachment of the second semiconductor die 204 to the flange 202. At least partial solidification of the first die attach material ensures that the first semiconductor die 200 is held in place by the first die attach material during attachment of the second semiconductor die 204 to the flange 202. In yet another embodiment, the first die attach material has a surface tension which prevents the first semiconductor die 200 from moving during attachment of the second semiconductor die 204 to the thermally conductive flange 202.

The method illustrated in FIG. 1 also includes attaching leads 206 to the thermally conductive flange 202 e.g. in the case of a circuit board implementation as described later herein or to an insulating member 208 secured to the flange 202 e.g. in the case of separate metals pads/leads as shown in FIG. 2 (Block 120). Each lead 206 is an electrical connection comprising a metal pad or metal trace that comes from the package. The leads 206 provide external electrical access to the semiconductor dies 200, 204 included in the multi-die package. In the case of the multi-die package shown in FIG. 2, the leads 206 are separate metal pads/leads attached to an insulating member 208 such as a ceramic or plastic window frame secured to the flange 202 to ensure proper electrical isolation. The insulating member 208 forms a cavity 210 around the dies 200, 204 attached to the flange 202. The cavity 210 can remain open or can be filled e.g. with an epoxy or gel, depending on the type of package. A lid (not shown) can be provided to enclose the dies 200, 204, or the package can be overmolded to encapsulate the dies 200, 204. The multi-die package can include additional components attached to the thermally conductive flange 202 such as input and output capacitors 212, 214 like MOSCAPS, regular (metal plate) capacitors, integrated passive devices, passive capacitor dies, etc. These additional components can be attached before or after the die attach process, or as part of the die attach process depending on the die attach materials used. Electrical conductors 216 such as bond wires, ribbons, etc. provide electrical connections between the leads 206 and the respective semiconductor dies 200, 204 and other components 212, 214 included in the multi-die package.

The first and second semiconductor dies 200, 204 shown in FIG. 2 can both be power transistor dies. For example in the case of a Doherty amplifier circuit, the first power transistor die 200 can be the main amplifier of the Doherty amplifier circuit and the second power transistor die 204 can be the peaking amplifier of the Doherty amplifier circuit. In one embodiment, the first semiconductor die 200 is made of GaN and the second semiconductor die 204 is made of Si so as to take advantage of higher GaN performance while still maintaining sufficient linearity over the wideband operating range of the Doherty amplifier circuit. In other examples, the second semiconductor die 204 can be a power transistor die such as a power amplifier die e.g. made of GaN, GaAs, SiGe, etc. and the first semiconductor die 200 can be a logic die such as a driver die for driving the power transistor die and e.g. made of Si.

Figure 3:
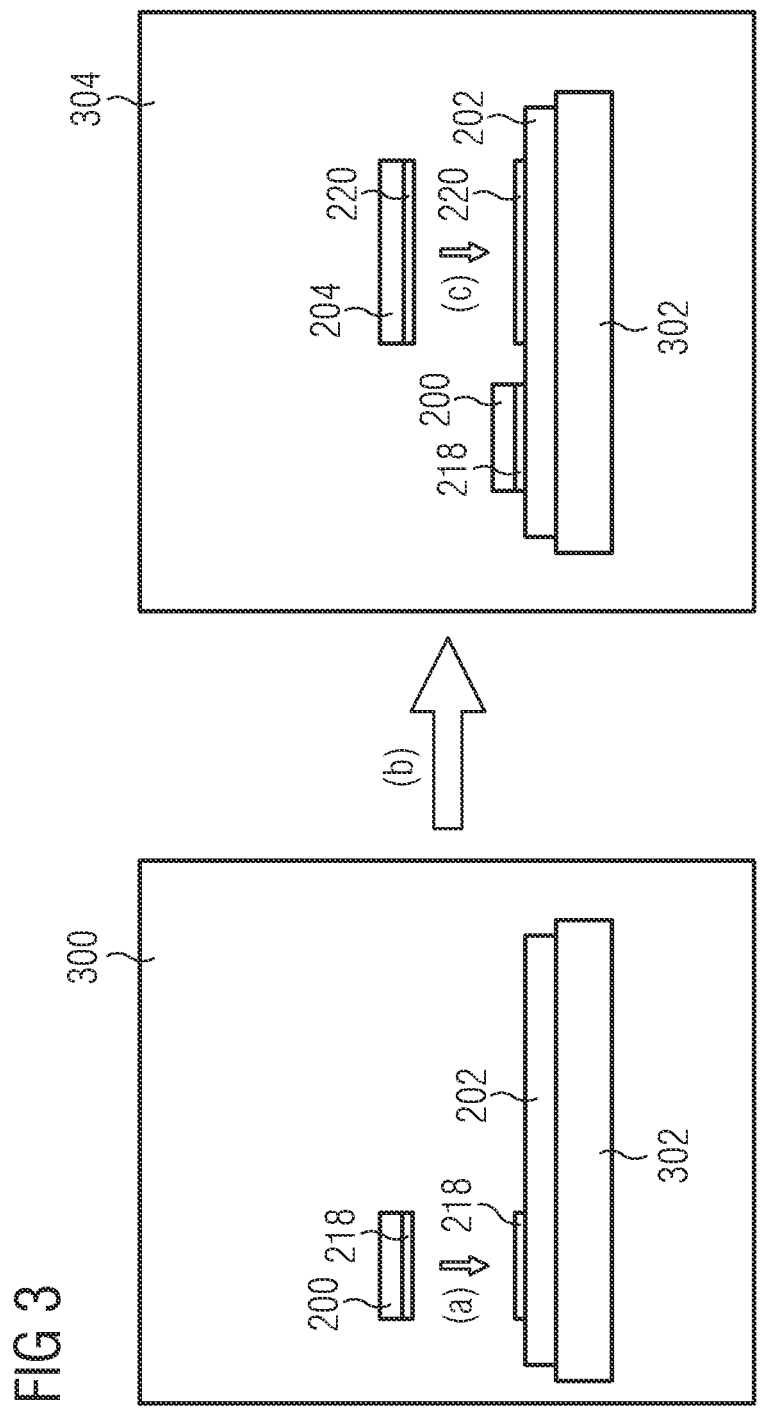
FIG. 3 illustrates a flow diagram of an embodiment of a method of manufacturing a multi-die package using multiple process chambers.

FIG. 3 illustrates an embodiment of the manufacturing method shown in FIG. 1, according to which the first semiconductor die 200 is attached to the thermally conductive flange 202 before the second semiconductor die 204 and the first die attach material 218 remains in a solid state during attachment of the second semiconductor die 204 to the thermally conductive flange 202. The thermally conductive flange 202 is placed in a first die attach chamber 300 for attaching the first semiconductor die 200 to the flange 202. The first die attach process is shown in the left-hand side of FIG. 3. The flange 202 is supported by a base 302 inside the first chamber 300. In some cases, the base 302 is a heat spreader which is attached to the bottom side of the thermally conductive flange 202 facing away from the first semiconductor die 200. The heat spreader 302 can be attached to the thermally conductive flange 202 during attachment of the first semiconductor die 200 to the flange 202.

The first die attach material 218 can be a higher melting backside metal and/or solder system having a die attach temperature range which ensures that the first semiconductor die 200 will not move i.e. is held in place during the subsequent die attach process for the second semiconductor die 204. Alternatively, the first die attach material 218 can be a sinter material which provides a thermally and electrically sufficient connection to the flange 202 and which remains solid during the subsequent die attach process. In another example, the first die attach material 218 can have a lower melting point but the first die attach material 218 partly or fully solidifies during attachment of the first semiconductor die 200 to the thermally conductive flange 202 and remains partly or fully solidified during attachment of the second semiconductor die 204 to the flange 202. In yet another example, the first die attach material 218 has a surface tension which prevents the first semiconductor die 200 from moving during attachment of the second semiconductor die 204 to the thermally conductive flange 202. Still other options for the first die attach material 218 include glue or epoxy so long as the integrity and reliability of the glue/epoxy is not compromised during the subsequent die attach process.

The first die attach material 218 can comprise more than one layer or component, and can be applied to the backside of the first die 200, to the topside of the flange 204 or to both the backside of the first die 200 and topside of the flange 202. The first semiconductor die 200 is attached to the thermally conductive flange 202 via the first die attach material 218 in the first die attach chamber 300 as indicated by step (a) in FIG. 3. After the first semiconductor die 200 has been aligned, the first die 200 is attached to the flange 202 via the first die attach material 218. More than one die and passives, capacitors, etc. can be attached in step (a) so long as the die attach material used is compatible with the process parameters (e.g. temperature, pressure, etc.) for the die attach process of step (a).

The thermally conductive flange 202 is then moved from the first die attach chamber 300 to a different die attach chamber 304 for attaching the second semiconductor die 204 to the thermally conductive flange 202, which is indicated by step (b) in FIG. 3. The flange 202 is supported by the same or different base 302 inside the second chamber 304. In some cases, the die attach temperature range of the second die attach material 220 is less than that of the first die attach material 218 so that the first semiconductor die 200 remains fixedly attached to the flange 202 during the second die attach process. The second die attach process allows components with a lower-temperature die attach system to be placed without de-solidifying the interface between the flange 202 and the previously placed components 200. Suitable die attach systems for the second die attach material 220, but are not limited to: eutectic solders such as AuSn or other eutectic metal systems such as AgSn, CuSn, etc.; glues and epoxies with a suitably low curing temperature; etc. In other cases, the first die attach material 218 partly or fully solidifies during attachment of the first semiconductor die 200 to the thermally conductive flange 202 and remains partly or fully solidified during attachment of the second semiconductor die 204 to the flange 202, or the first die attach material 218 at least has a surface tension which prevents the first semiconductor die 200 from moving during attachment of the second semiconductor die 204 to the thermally conductive flange 202.

Depending on the type of material used, the second die attach material 220 can be applied to the backside of the second die 204, to the topside of the flange 202 or to both the backside of the second die 204 and topside of the flange 202. After the second semiconductor die 204 has been aligned, the second die 204 is attached to the flange 202 via the second die attach material 220, which is indicated by step (c) in FIG. 3. More than one die can be attached in step (c) so long as the die attach material used is compatible with the process parameters (e.g. temperature, pressure, etc.) for the die attach process of step (c). The sequential die attach process described above can use different die attach chambers 300, 304 as shown in FIG. 3. More than two die attach passes can be performed to place many different component types.

Figure 4:
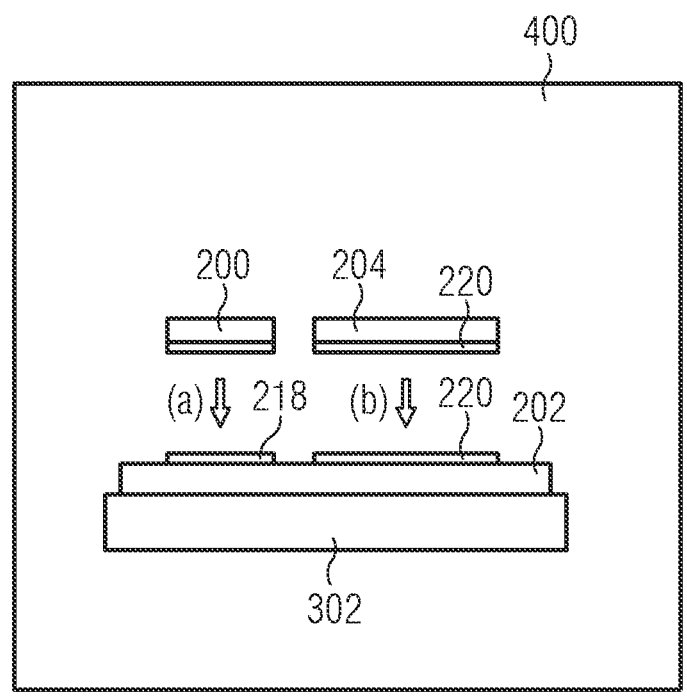
FIG. 4 illustrates a flow diagram of an embodiment of a method of manufacturing a multi-die package using a single process chamber.

FIG. 4 illustrates another embodiment of the manufacturing method shown in FIG. 1, according to which the die attach process can be sequential as described above in connection with FIG. 3 but performed in a single chamber 400 even with different die attach process parameters (e.g. temperature, pressure, etc.) for the different types of dies 200, 204 to be attached to the flange 202. Returning to the example of FIG. 2 with two different die types, the first die 200 is attached to the flange 202 during the die attach process labelled (a) in FIG. 4, and the second die 204 is attached to the flange 202 during a subsequent die attach process labelled (b) in FIG. 4. The first die 200 is held in place by the first die attach material 218 during the subsequent die attach process, e.g. because the first die attach 218 material has a higher die attach temperature range than the second die attach material 220 and therefore does not de-solidify (melt) during the subsequent die attach process. In other cases, the first die attach material 218 partly or fully solidifies during attachment of the first semiconductor die 200 to the thermally conductive flange 202 and remains partly or fully solidified during attachment of the second semiconductor die 204 to the flange 202, or the first die attach material 218 at least has a surface tension which prevents the first semiconductor die 200 from moving during attachment of the second semiconductor die 204 to the thermally conductive flange 202. More than two die attach passes can be performed in the single chamber 400 to place many different component types as described above.

Alternatively, the first semiconductor die 200 and the second semiconductor die 204 can be attached to the thermally conductive flange 202 as part of a common die attach process performed in the single die attach chamber 400 i.e. step (a) and step (b) in FIG. 4 are performed at the same time. According to this embodiment, components using different die attach systems are attached at the same time to the flange 202 in the same die attach chamber 400. Similar to any discrete die attach process, all components can be bonded on the same tool holder even though different die attach systems are used. All components can be aligned using the same fiducials (alignment marks) on the thermally conductive flange 202, and a reference (0/0) position can be set so that all components are placed at the same time until all components are attached to the same flange 202. This way, various die attach systems can be used and arbitrarily combined. Also, high placement accuracy is achieved because the flange 202 is not moved until after alignment and die attach of all components is completed. Different die alignment embodiments are described later in more detail.

Figure 5:
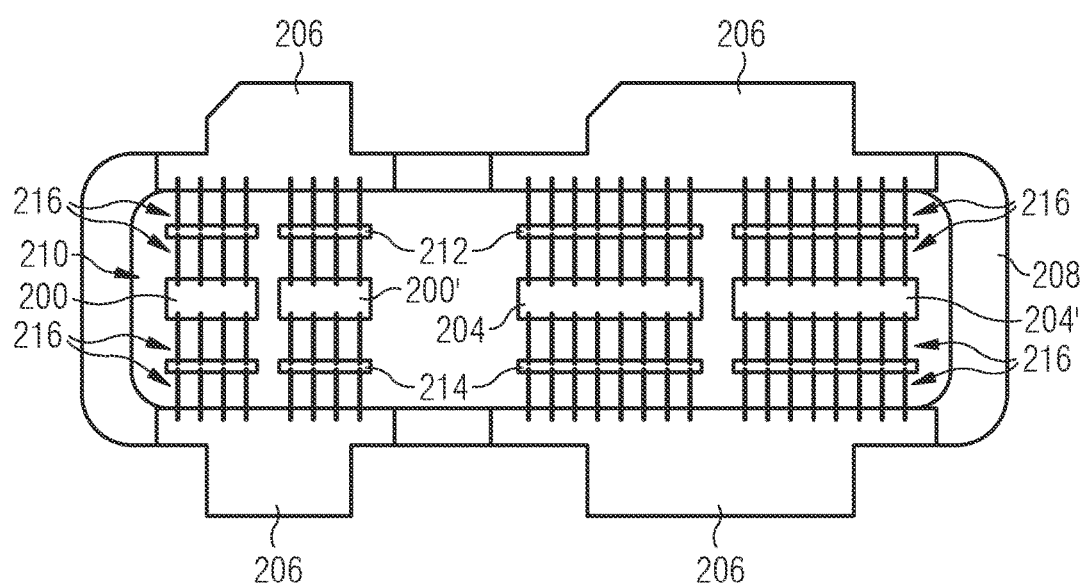
FIG. 5 illustrates a top-down plan view of another embodiment of a multi-die package.

FIG. 5 illustrates a top-down plan view of another embodiment of a multi-die package having semiconductor dies made of different semiconductor materials attached to the same thermally conductive flange. The embodiment shown in FIG. 5 is similar to the embodiment shown in FIG. 2. Different, however, the package includes a plurality of semiconductor dies 200, 200' made of the first semiconductor material and attached to the thermally conductive flange 202 via the first die attach material 218 (out of view in FIG. 5), and a plurality of semiconductor dies 204, 204' made of the second semiconductor material and attached to the flange via 202 the second die attach material 220 (also out of view in FIG. 5). For example in the case of a Doherty amplifier circuit, the main amplifier can be realized using two or more power transistor dies 200, 200' of the first semiconductor material. The peaking amplifier similarly can be realized using two or more power transistor dies 204, 204' of the second semiconductor material. Other types of power transistor circuit designs can utilize similar die redundancy in their physical implementation. In the case of Si as a semiconductor material, some of the semiconductor dies made of Si and attached to the flange 202 can be passive capacitor dies e.g. input and/or output capacitors 212, 214 as previously described herein.

Figure 6:
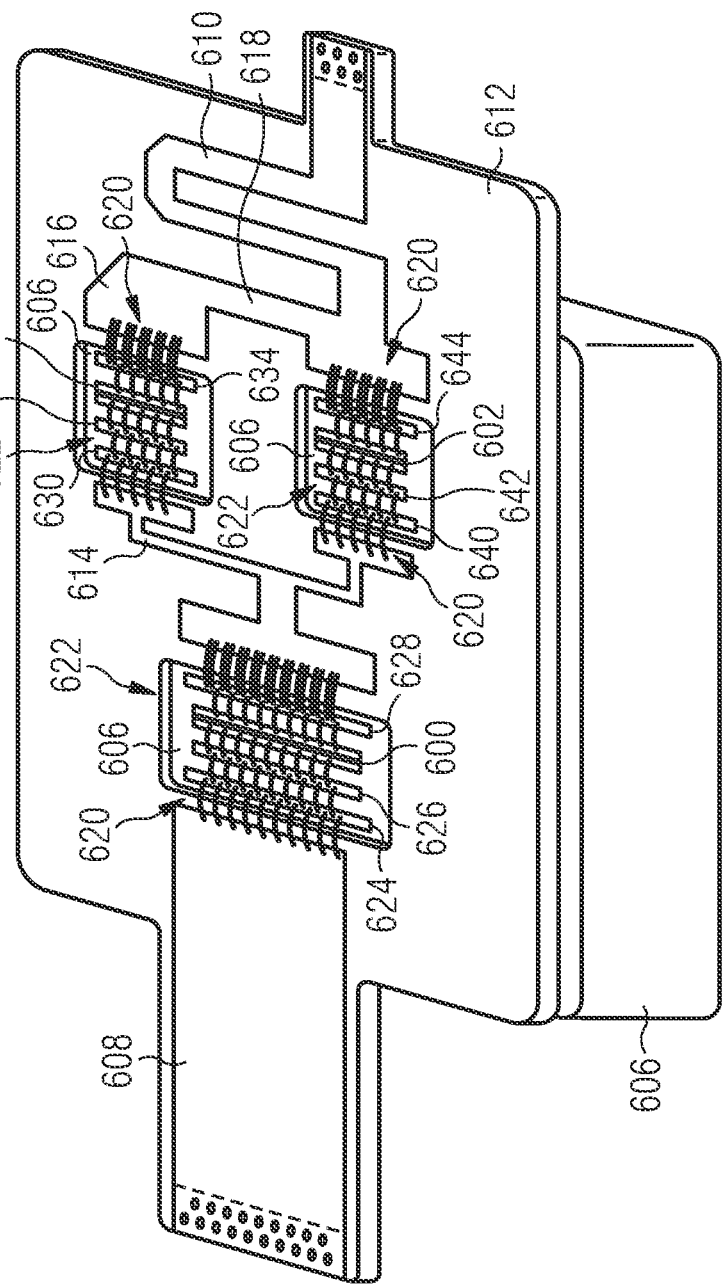
FIG. 6 illustrates a top-down plan view of yet another embodiment of a multi-die package.

FIG. 6 illustrates a side perspective view of yet another embodiment of a multi-die package having semiconductor dies 600, 602, 604 made of different semiconductor materials attached to the same thermally (and optionally electrically) conductive flange 606. The embodiment shown in FIG. 6 is similar to the embodiment shown in FIG. 2. Different, however, the leads of the package are realized as metal traces 608, 610 formed as part of a circuit board 612 such as a PCB (printed circuit board). The circuit board 612 is attached directly to the metal flange 606 e.g. using glue or solder (electrically conductive or non-conductive). The circuit board 612 can be constructed as described in U.S. patent application Ser. No. 14/673,928 filed on Mar. 31, 2015, the content of said application incorporated herein by reference in its entirety.

According to the embodiment shown in FIG. 6, the package leads 608, 610 are provided as part of the circuit board 612 and without additional insulating member such as a ceramic window frame while still having proper electrical isolation. Various power amplifier functions such as output matching for Doherty amplifier design, input match, driver+ input+output match, etc. can be integrated at the package level by various metal traces 614, 616, 618 which form part of the package leads 608, 610 of the circuit board 612. In addition, the leads 608, 610 of the multi-die package are provided as part of the circuit board 612 without requiring additional external connectors for the signal path. Electrical conductors 620 such as wire bonds, ribbons, etc. electrically connect respective ones of the metal traces 608, 610, 614 (616, 618) to different terminals of the semiconductor dies 600, 602, 604 to form the desired circuit.

The semiconductor dies 600, 602, 604 are attached to the flange 606 as previously described herein through openings 622 in the circuit board 612. Some semiconductor dies 600, 602, 604 are active semiconductor dies such as power transistor dies, power diode dies, etc. and/or contain passive components such as capacitors, inductors and resistors. Each active semiconductor die 600, 602, 604 can be a lateral or vertical device or some other form of transistor e.g. used for amplification.

One or more additional semiconductor dies 624-644 disposed in the openings 622 formed in the circuit board 612 and attached to the flange 606 can be passive semiconductor dies devoid of active devices such as capacitor, resistor or inductor dies. In the case of a capacitor die, one of the capacitor terminals is at the bottom side of the capacitor die and attached to the thermally conductive flange 606. The other capacitor terminal is disposed at the opposite side of the capacitor die i.e. the side facing away from the flange 606. The multi-die package can be enclosed with an optional lid (not shown) so that the package is an open-cavity package as previously described herein.

According to an embodiment, one of the active semiconductor dies 600 is a driver stage die of a Doherty amplifier circuit, a second one of the active semiconductor dies 602 is a main (or carrier) amplifier die of the Doherty amplifier circuit, and a third one of the active semiconductor dies 604 is a peaking amplifier die of the Doherty amplifier circuit. Passive semiconductor dies 624-644 which form part of various match networks of the Doherty amplifier circuit such as input and output match networks also can be placed in the circuit board openings 622 and attached to the thermally conductive flange 606 as shown in FIG. 6. The semiconductor dies 600-604, 624-644 are electrically interconnected through the metal traces 608, 610, 614, 616, 618 of the circuit board 612 and wire bonds or other types of electrical conductors 620 to form a circuit such as a Doherty amplifier circuit, a power amplifier circuit, etc.

Figure 7:
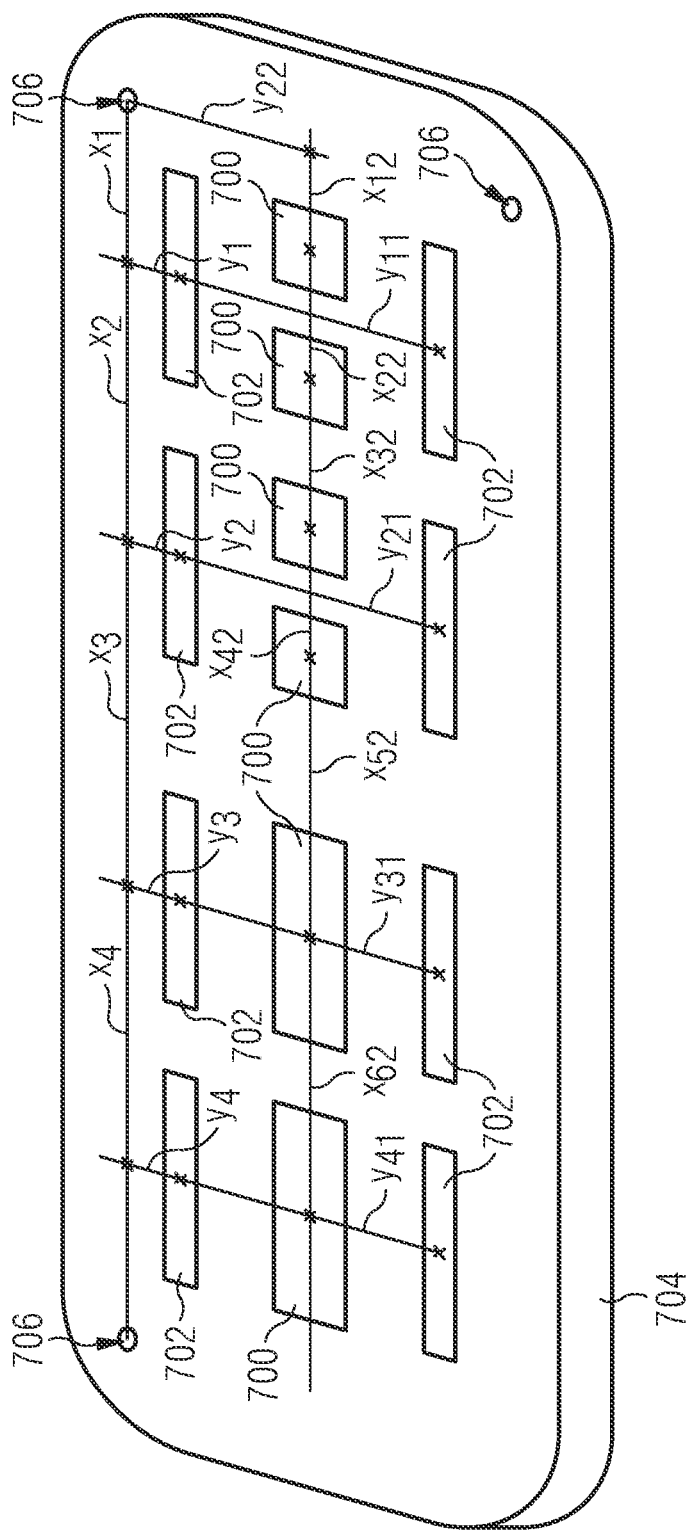
FIG. 7 illustrates a perspective view of an embodiment of aligning dies made of different semiconductor material, prior to being attached to the same thermally conductive flange.

FIG. 7 illustrates an embodiment of aligning dies 700, 702 made of different semiconductor material, prior to being attached to the same thermally (and optionally electrically) conductive flange 704. According to this embodiment, first semiconductor dies 700 e.g. with a higher die attach temperature range are aligned with respect to a plurality of fiducials (alignment marks) 706 on the thermally conductive flange 704 e.g. via pattern recognition prior to attachment of these semiconductor die 700 to the flange 704. One of the fiducials 706 serves as a reference position (x=0, y=0). Second semiconductor dies 702 e.g. with a lower die attach temperature range are then aligned with respect to the same fiducials 706 on the flange 704 as the first group of semiconductor dies 700 prior to attachment of the second group of semiconductor dies 702 to the flange 704. The x-y alignment coordinates for the different semiconductor dies 700, 702 are shown as $x_n$, $y_m$ in FIG. 7.

Figure 8:
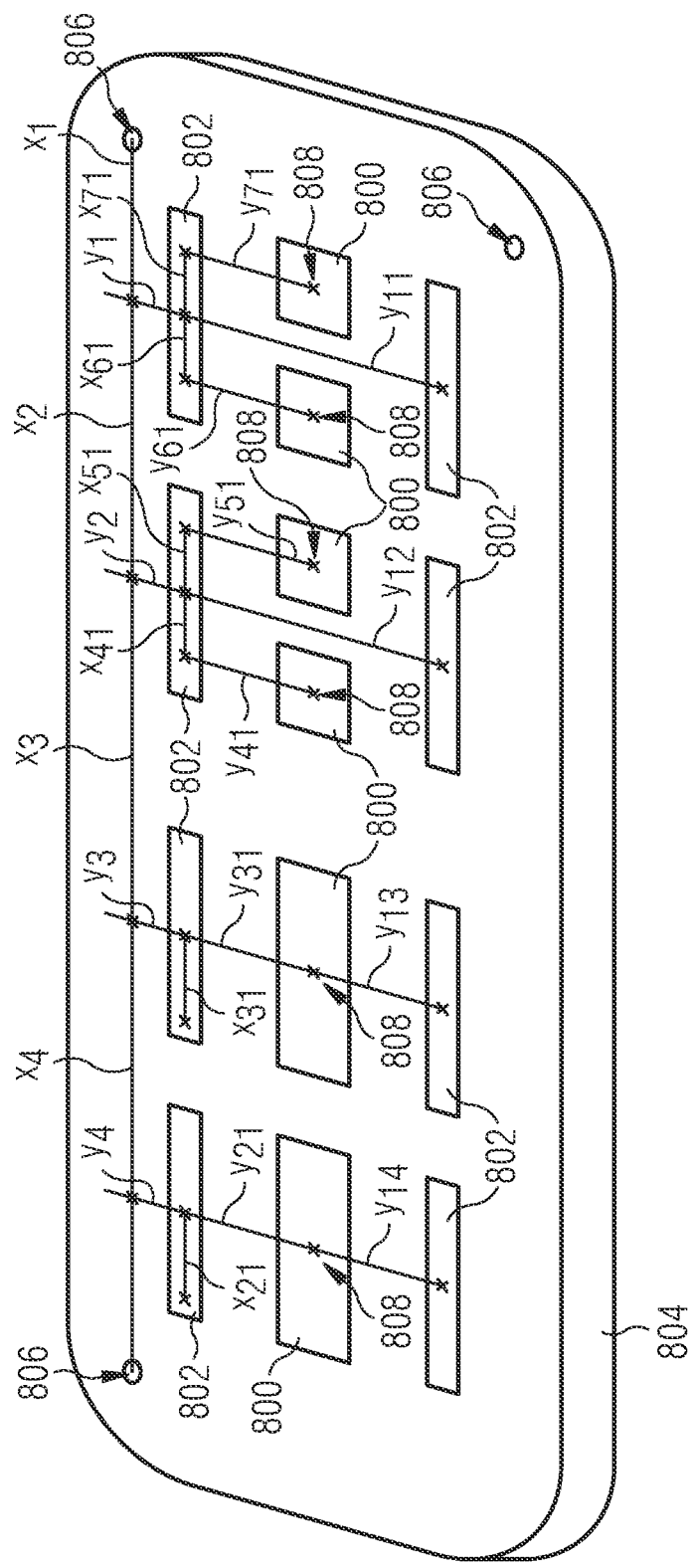
FIG. 8 illustrates a perspective view of another embodiment of aligning dies made of different semiconductor material, prior to being attached to the same thermally conductive flange.

FIG. 8 illustrates another embodiment of aligning dies 800, 802 made of different semiconductor material, prior to being attached to the same thermally (and optionally electrically) conductive flange 804. According to this embodiment, first semiconductor dies 800 e.g. with a higher die attach temperature range are aligned with respect to a plurality of fiducials (alignment marks) 806 on the thermally conductive flange 804 e.g. via pattern recognition prior to attachment of these semiconductor die 800 to the flange 804. Second semiconductor dies 802 e.g. with a lower die attach temperature range are then aligned with respect to a plurality of fiducials 808 on the first group of semiconductor dies 800 e.g. via pattern recognition prior to attachment of the second group of semiconductor dies 802 to the flange 804. That is, different than the embodiment shown in FIG. 7, the first placed group of semiconductor dies 800 is used as alignment marks for placement of the second group of dies 802. The x-y alignment coordinates for the different semiconductor dies 800, 802 are shown as $x_n$, $y_m$ in FIG. 8.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a multi-die package, comprising:
    attaching a first semiconductor die made of a first semiconductor material to a thermally conductive flange via a first die attach material;
    attaching a second semiconductor die to the same thermally conductive flange as the first semiconductor die via a second die attach material, the second semiconductor die being made of a second semiconductor material different than the first semiconductor material, and wherein the first semiconductor die is held in place by the first die attach material during attachment of the second semiconductor die to the flange; and
    attaching leads to the thermally conductive flange or to an insulating member secured to the flange, the leads providing external electrical access to the first and second semiconductor dies,
    wherein the first semiconductor die is a main amplifier of a Doherty amplifier circuit and the second semiconductor die is a peaking amplifier of the Doherty amplifier circuit,
    wherein the first semiconductor die is made of gallium nitride (GaN) and the second semiconductor die is made of silicon (Si).

2. The method of claim 1, wherein a plurality of semiconductor dies made of the first semiconductor material are attached to the thermally conductive flange via the first die attach material, and wherein a plurality of semiconductor dies made of the second semiconductor material are attached to the thermally conductive flange via the second die attach material.

3. The method of claim 2, wherein some of the semiconductor dies made of the first semiconductor material are power transistor dies, and wherein other ones of the semiconductor dies made of the first semiconductor material are passive capacitor dies.

4. The method of claim 1, wherein the first die attach material has a first die attach temperature range, and wherein the second die attach material has a second die attach temperature range which is different than the first die attach temperature range.

5. The method of claim 4, wherein the first die attach temperature range is greater than the second die attach temperature range, wherein the first semiconductor die is attached to the thermally conductive flange before the second semiconductor die, and wherein the first die attach material remains in a solid state during attachment of the second semiconductor die to the thermally conductive flange.

6. The method of claim 5, further comprising:
    placing the thermally conductive flange in a first die attach chamber for attaching the first semiconductor die to the thermally conductive flange; and
    moving the thermally conductive flange from the first die attach chamber to a second die attach chamber for attaching the second semiconductor die to the thermally conductive flange.

7. The method of claim 5, further comprising:
    aligning the first semiconductor die with respect to a plurality of fiducials on the thermally conductive flange prior to attachment of the first semiconductor die to the thermally conductive flange; and
    aligning the second semiconductor die with respect to the same fiducials as the first semiconductor die prior to attachment of the second semiconductor die to the thermally conductive flange.

8. The method of claim 5, further comprising:
    aligning the first semiconductor die with respect to a plurality of fiducials on the thermally conductive flange prior to attachment of the first semiconductor die to the thermally conductive flange; and
    aligning the second semiconductor die with respect to a plurality of fiducials on the first semiconductor die prior to attachment of the second semiconductor die to the thermally conductive flange.

9. The method of claim 1, wherein the first semiconductor die and the second semiconductor die are attached to the thermally conductive flange as part of a common die attach process performed in a single die attach chamber.

10. The method of claim 9, further comprising:
    aligning the first semiconductor die and the second semiconductor die with respect to a plurality of fiducials on the thermally conductive flange prior to attachment of the first semiconductor die and the second semiconductor die to the thermally conductive flange.

11. The method of claim 1, wherein the first die attach material partly or fully solidifies during attachment of the first semiconductor die to the thermally conductive flange and remains partly or fully solidified during attachment of the second semiconductor die to the flange.

12. The method of claim 1, wherein the first die attach material has a surface tension which prevents the first semiconductor die from moving during attachment of the second semiconductor die to the thermally conductive flange.

* * * * *